United States Patent
Sweegers et al.

(10) Patent No.: US 10,026,884 B2
(45) Date of Patent: Jul. 17, 2018

(54) LIGHT EMITTING DEVICE COOLING

(71) Applicant: KONINKLIJKE PHILIPS N.V., Eindhoven (NL)

(72) Inventors: Norbertus Antonius Maria Sweegers, Aachen (DE); Marc Andre de Samber, Aachen (DE); Patrick Zuidema, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/557,087

(22) PCT Filed: Mar. 3, 2016

(86) PCT No.: PCT/EP2016/054515
§ 371 (c)(1),
(2) Date: Sep. 9, 2017

(87) PCT Pub. No.: WO2016/142258
PCT Pub. Date: Sep. 15, 2016

(65) Prior Publication Data
US 2018/0062057 A1   Mar. 1, 2018

(30) Foreign Application Priority Data
Mar. 11, 2015   (EP) ..................................... 15158632

(51) Int. Cl.
*H01L 33/00* (2010.01)
*H01L 33/64* (2010.01)
(Continued)

(52) U.S. Cl.
CPC .......... *H01L 33/644* (2013.01); *H01L 33/505* (2013.01); *H01L 33/62* (2013.01);
(Continued)

(58) Field of Classification Search
CPC .... H01L 23/36–23/3738; H01L 33/644; H01L 33/505; H01L 33/62; H01L 33/642;
(Continued)

(56) References Cited

U.S. PATENT DOCUMENTS

| | | | | |
|---|---|---|---|---|
| 8,987,774 | B2* | 3/2015 | Oyamada | H01L 33/505 257/100 |
| 2006/0208364 | A1* | 9/2006 | Wang | H01L 33/486 257/778 |
| 2007/0057364 | A1* | 3/2007 | Wang | C03C 8/02 257/701 |
| 2007/0217202 | A1 | 9/2007 | Sato | |
| 2009/0230417 | A1 | 9/2009 | Tsai et al. | |
| 2010/0102339 | A1* | 4/2010 | Chang | H01L 33/486 257/98 |
| 2010/0213479 | A1 | 8/2010 | Li et al. | |
| 2010/0308362 | A1 | 12/2010 | Herrmann | |
| 2011/0294242 | A1 | 12/2011 | Lu | |

(Continued)

FOREIGN PATENT DOCUMENTS

| | | |
|---|---|---|
| CN | 203812916 U | 9/2014 |
| EP | 2500956 A2 | 9/2012 |
| KR | 20140135554 A | 11/2014 |

OTHER PUBLICATIONS

EPO as ISA, "International Search Report and Written Opinion" dated May 9, 2016 from International Application No. PCT/EP2016/054515, filed Mar. 3, 2016, 16 pages.

(Continued)

*Primary Examiner* — Victor A Mandala
(74) *Attorney, Agent, or Firm* — Brian D. Ogonowsky; Patent Law Group LLP

(57) ABSTRACT

A light emitting device such as luminaire includes one or more light emitting device chips mounted on a board. The light emitting device chips have electrical contacts and are flip chip mounted to board with the electrical contacts connected to contact pads. Sidewall metallizations on the sidewalls of the light emitting device chips are connected by metal heat transfer elements to heat dissipation regions of board. The metal heat transfer elements may be of solder which may be deposited using equipment conventionally used for attaching surface mount devices.

11 Claims, 6 Drawing Sheets

(51) Int. Cl.
  *H01L 33/62*   (2010.01)
  *H01L 33/50*   (2010.01)
  *F21V 19/00*   (2006.01)
  *H01L 25/075*  (2006.01)
  *F21K 9/232*   (2016.01)
  *F21Y 115/10*  (2016.01)

(52) U.S. Cl.
  CPC ............ H01L 33/642 (2013.01); *F21K 9/232* (2016.08); *F21V 19/0015* (2013.01); *F21Y 2115/10* (2016.08); *H01L 25/0753* (2013.01); *H01L 2933/0066* (2013.01); *H01L 2933/0075* (2013.01)

(58) Field of Classification Search
  CPC ......... H01L 2933/0066; H01L 25/0753; H01L 2933/0075; F21V 19/0015; F21K 9/232; F21Y 2115/10
  See application file for complete search history.

(56) References Cited

U.S. PATENT DOCUMENTS

| | | | |
|---|---|---|---|
| 2012/0241793 A1 | 9/2012 | In et al. | |
| 2013/0010481 A1 | 1/2013 | Qin | |
| 2013/0294060 A1* | 11/2013 | Van Laanen | ............... F21V 3/02 362/218 |
| 2014/0341247 A1 | 11/2014 | Strauss et al. | |

OTHER PUBLICATIONS

Extended European Search Report dated Aug. 31, 2015 from European Patent Application No. 15158632.8 filed Mar. 11, 2015, 8 pages.

* cited by examiner

LIGHT EMITTING DEVICE COOLING

CROSS-REFERENCE TO RELATED APPLICATIONS

The present application is a § 371 application of International Application No. PCT/EP2016/054515 filed on Mar. 3, 2016 and titled "LIGHT EMITTING DEVICE COOLING," which claims the benefit of European Patent Application No. 15158632.8 filed on Mar. 11, 2015. International Application No. PCT/EP2016/054515 and European Patent Application No. 15158632.8 are incorporated herein.

FIELD OF THE INVENTION

The invention relates to a light emitting device and method of manufacture.

BACKGROUND OF THE INVENTION

Semiconductor light emitting devices are increasingly been used in a wide variety of applications. In a particular example, luminaires using a number of light emitting diodes to emit light are increasingly being used for lighting applications to replace technologies such as incandescent light bulbs or fluorescent lamps. By mounting a plurality of light emitting diodes on a substrate, a variety of different light outputs can be achieved.

The light output of light emitting diodes in modern light emitting devices is typically limited by temperature related behaviour. One constraint on light output is provided by the thermo-electric behaviour of the semiconductor material of the light emitting diodes, for example thermal and current droop. In order to produce white light, a suitable phosphor is often used and the phosphor can quench at high temperatures. Therefore, the temperature of the phosphor needs to be kept below such temperatures with the light emitting diodes in use. However, typically phosphors are located adjacent to and in contact with light emitting diodes and hence as the light emitting diodes heat up the phosphor does too.

Light emitting devices are often required to work for long periods of time without replacement. In some cases, the light emitting devices are located at locations where access is difficult. Even where access is relatively straightforward, there is still a need for reasonable lifetimes. The long term reliability of light emitting diodes is often directly related to the temperature of the operating condition, with high temperatures leading to reduced lifetimes.

For all these reasons, the extraction of heat from light emitting device packages is necessary.

In conventional luminaires, light emitting diodes may be soldered to a substrate and heat generated in the light emitting diode passes by thermal conduction through the electrical contacts to the substrate. However, there is still a need for improved thermal management of light emitting diodes.

SUMMARY OF THE INVENTION

The invention is defined by the claims.

According to examples in accordance with an aspect of the invention, there is provided a light emitting device comprising a light emitting device chip comprising:

an insulating substrate;

a light emitting semiconductor layer on the insulating substrate, the light emitting semiconductor layer comprising a light emitting region; and electrical contacts to the light emitting semiconductor layer; and a board having a plurality of contact pads and at least one heat dissipation region;

wherein the light emitting device chip is mounted with the electrical contacts connected to the contact pads on the board and with a metal heat transfer element in contact with both the sidewalls of the light emitting device chip and with a heat dissipation region of the board.

By directly connecting a metal heat transfer element between the sides of the chip and the board, heat dissipation is improved. This is in addition to the heat transfer between the electrical contacts to the light emitting layer and the contact pads on the board. Thus, there is an additional heat transfer path which allows for improved heat dissipation and hence a reduction in the temperature of the light emitting device chip for any given conditions of operation.

In this way, the thermal load on the light emitting device is reduced which may have the effect of increasing the lifetime of the light emitting device and/or optimising light output.

The arrangement is also highly manufacturable since provision of elements adjacent to chips is readily achieved using conventional equipment for surface mounting of chips on boards.

The light emitting device chip may further comprise sidewall metallisations on the sidewalls of the insulating substrate, the sidewall metallisations being electrically isolated from the light emitting region; the metal heat transfer element being in contact with the sidewall metallisations. The sidewall metallisations provide a good transfer of heat and also provide a surface to which the metal heat transfer element may be attached.

The metal heat transfer element may comprise solder. Solder can be introduced on the sides of a chip on the board using conventional apparatus used for surface mounting chips.

The use of solder for the metal heat transfer element allows for manufacture using equipment typically used for soldering surface mount chips to a board. Such equipment is widely available. Therefore, the use of this material allows for a cost-effective manufacture.

Alternatively, the metal heat transfer element may include a metal frame around the light emitting device chip, in contact with the sidewall metallisations. Such a metal frame can provide a suitable additional heat path for removing heat from the light emitting device in use.

The light emitting device chip may be flip chip mounted on the board with the electrical contacts connecting to the contact pads on the board.

A phosphor may be provided facing away from the board. The sidewall metallisations may extend over the sidewalls of the phosphor as well as the insulating substrate. In this way, heat dissipation can be improved since heat may transfer through the phosphor.

The board may have at least one electrically isolated heat sink pad on the heat dissipation region of the board, wherein the metallisation covers the sidewall metallisations and the at least one heat sink pad. Where the metal heat transfer element is of solder, the pad may define the region of the board to which solder is to be applied, for example in the case that the solder is contained on the pad by surface tension when the solder is melted. This ensures that the solder heat transfer elements are correctly located on the board and away from pads used for driving the light emitting device electrically.

Each heat dissipation region may include a plurality of vias containing metal. In this way, heat dissipation can be enhanced since the vias may deliver enhanced thermal conduction of heat away from the heat transfer elements.

The board may have a metal core and an insulated surface. The metal core may provide for heat transfer.

The insulating substrate may be sapphire.

The light emitting device may be a luminaire.

In an aspect of the invention, there is provided a luminaire having a plurality of light emitting device chips, each comprising: an insulating substrate; a light emitting semiconductor layer on the insulating substrate; electrical contacts to the light emitting layer; and sidewall metallisations on the sidewalls of the insulating substrate, the sidewall metallisations not being electrically connected;

wherein the light emitting device chips are mounted with the electrical contacts connected to the contact pads on the board and with a metal heat transfer element on the side of the light emitting device chip in contact with both the sidewall metallisations and with a heat dissipation region of the board.

A further aspect of the invention relates to a method of bonding a light emitting device chip to a board, wherein the light emitting device chip comprises an insulating substrate; a light emitting semiconductor layer on the insulating substrate; electrical contacts to the light emitting layer on a first major surface of the light emitting layer; and sidewall metallisations on the sidewalls of the insulating substrate; the method comprising:

flip chip bonding the light emitting device chip to the board, with the first major surface facing the board and with the electrical contacts on the first major surface being connected to corresponding contact pads on the board; and soldering the sidewall metallisations to heat dissipation regions of the board.

By using a soldering process in this way it is straightforward to manufacture an improved light emitting device with improved heat handling without significantly increasing the complexity and cost of the assembly.

The step of soldering the sidewall metallisations may take place at the same time as the step of flip chip bonding, in a single heating operation, or in a separate step. In the latter case, the step of flip chip bonding may use a first solder and the step of soldering the sidewall metallisations uses a second solder, the second solder having a lower melting point than the first solder.

The board may have at least one isolated heat sink pad and the step of soldering the sidewall metallisations may comprise introducing solder and providing heat to melt the solder to cover the sidewall metallisations and the isolated heat sink pad and to extend between the sidewall metallisations and the isolated heat sink pad. In this way, the isolated heat sink pad or pads defines the region of the solder and hence ensures the correct form of solder elements.

In a yet further aspect, there is provided a method of bonding a light emitting device chip to a board, wherein the light emitting device chip comprises an insulating substrate; a light emitting semiconductor layer on the insulating substrate; electrical contacts to the light emitting layer on a first major surface of the light emitting layer; and sidewall metallisations on the sidewalls of the insulating substrate; the method comprising:

flip chip bonding the light emitting device chip to the board, with the first major surface facing the board and with the electrical contacts on the first major surface being connected to corresponding contact pads on the board; and providing a metal frame around the light emitting device chip and solder between the metal frame and the board and between the metal frame and the sidewall metallisations; and reflowing the solder to fix the metal frame to the board.

The reflowing and flip chip bonding steps may use a single heating operation or alternatively be sequential.

The method may further comprise flip chip bonding a plurality of said light emitting device chips to said board to manufacture a luminaire.

BRIEF DESCRIPTION OF THE DRAWINGS

Examples of the invention will now be described in detail with reference to the accompanying drawings, in which.

DETAILED DESCRIPTION OF THE EMBODIMENTS

Figure 1:
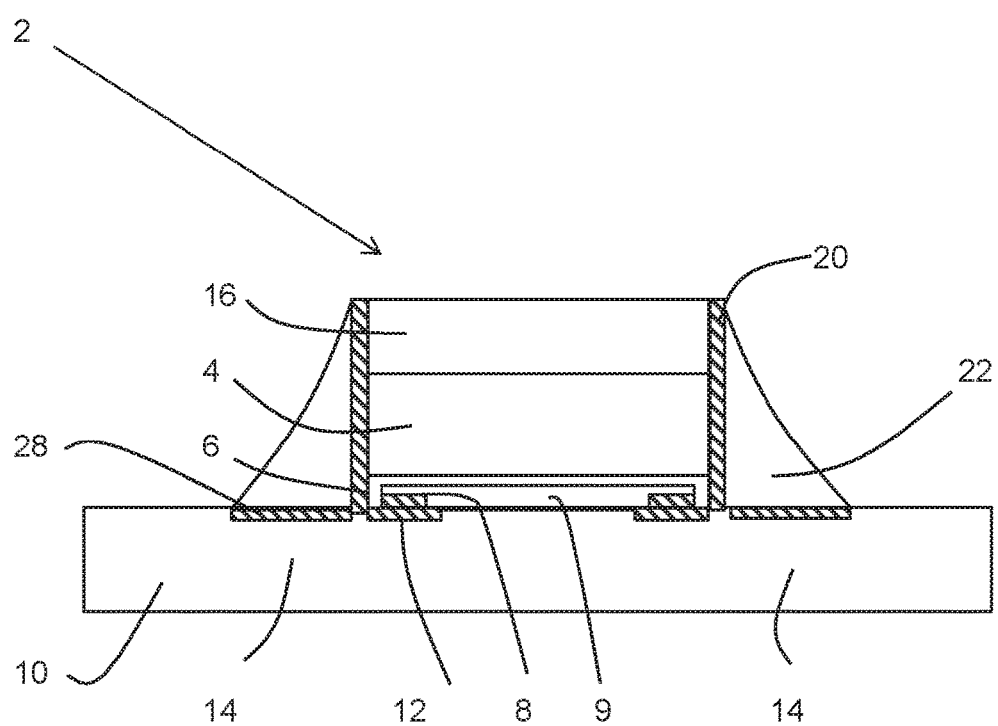
FIG. 1 shows a first embodiment of a light emitting device according to the invention.

The invention provides a method of manufacturing a light emitting device and the resulting device.

A light emitting device chip 2 according to an example has a sapphire substrate 4 and a light emitting semiconductor layer 6 on one face of the sapphire substrate 4. The light emitting semiconductor layer 6 is an epilayer on the sapphire substrate 4. Electrical contacts 8 are provided on a first major surface of the light emitting device chip directly connecting to the light emitting semiconductor layer. The light emitting semiconductor layer 6 comprises a light emitting diode which may be referred to generally as a light emitting region 9, and may have a number of sub-layers doped n and p type to emit light when an electric current is passed through, the current being introduced from electrical contacts 8. The light emitting diode 9 is electrically isolated from the edges of the light emitting semiconductor layer 6.

The light emitting device chip 2 is mounted on board 10, the board having a plurality of contact pads 12 and at least one heat dissipation region 14. A heat sink pad 28 is provided on each heat dissipation region 14. The light emitting device chip is mounted with the electrical contacts 8 directly connected to the contact pads 12, in the orientation known as flip chip mounting with the first major surface facing the board 10.

A phosphor 16 is provided on the second major surface, that is the face of the light emitting device chip opposite the first major surface, the side facing away from the board. The material of the phosphor 16 is selected to provide the desired spectrum of light. For example, a phosphor of one composition may be used to provide a warm light and a phosphor of another composition may be used to provide a spectrum matching daylight. Those skilled in the art are able to select a suitable phosphor material depending on the desired output characteristics of the light emitting device.

A sidewall metallisation 20 in the form of a highly reflective sidewall is provided on each of the four sides of the light emitting device chip and the phosphor. The sidewall metallisation 20 is a thin metal film which extends across the sidewalls of the light emitting semiconductor layer 6, the sapphire substrate 4 and phosphor 16. The sidewall metallisation is not a true electrical contact and is electrically isolated from the light emitting region 9 of light emitting semiconductor layer 6. It has the function of reflecting light so that light that would otherwise pass through the sidewall of the substrate 4 or phosphor 16 is emitted from the light emitting device. The sidewall metallisation 20 is a multi-layer, with a layer of aluminium on the sidewalls of the light emitting device chip and the phosphor to deliver good reflective properties and an upper solderable layer, for example of Nickel/Gold.

Figure 2:
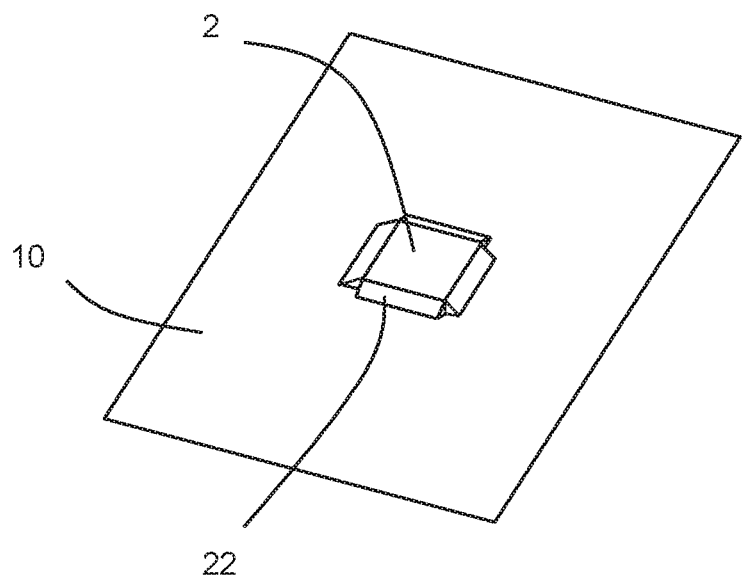
FIG. 2 shows a perspective view of a single light emitting device chip mounted on a board as illustrated in FIG. 1.

The sidewall metallisations 20 are connected to respective heat dissipation regions 14 by means of metal heat transfer elements 22 of solder which extend between the sidewall metallisation 20 and the heat sink pads 28 on the upper side of the heat dissipation regions 14. As illustrated in FIG. 2, the metal heat transfer elements 22 are provided on each side wall of the light emitting device chip 2.

The metal connections provide an additional heat path and allow for improved thermal management.

Note that although FIGS. 1 and 2 illustrate a single light emitting device chip 2 mounted on board 10, in practical implementations there may be a plurality of light emitting device chips mounted on the board, for example in a luminaire a number of light emitting device chips are typically required.

The light emitting device is straightforward to manufacture using existing surface mount techniques.

The light emitting device chip 2 having light emitting layer 6 on sapphire substrate 4 has phosphor 16 applied on the second major surface of the sapphire substrate, the surface that will be the upper surface. Sidewall metallisations 20 are deposited by PVD of aluminium and then nickel/gold using a zincate process over the whole sidewall of the chip 2 including the sapphire substrate 4 and phosphor 16. The aluminium provides a reflective layer to reflect light back into the phosphor and the nickel/gold provides a solderable layer on top. In alternative arrangements, vapour deposition for any or all of these layers may be used.

Then, the chip 2 is flip chip mounted on board 10 with the electrical contacts 8 in contact with contact pads 12. This can be done with conventional surface mounting equipment. A suitable first solder such as AuSn may be used. Alternatively a non-soldering method such as Au—Au thermosonic bonding may be used to attach the flip chip component.

A second solder 22 is then dispensed to connect the sidewall metallisations 20 to the heat dissipation regions 14. The second solder may be in particular a lower melting point solder than the first solder—Tin Silver Copper solder (SAC) is used in the specific embodiment described. The solder is then heated to melt the solder. This is possible in conventional surface mount equipment. The solder wets the sidewall metallisations 20 and the heat sink pads 28. Thus, the extent of the sidewall metallisations 20 and the heat sink pads 28 serves to define the shape of the solder 22 acting as the heat transfer elements.

The solder is then cooled to the form illustrated in FIG. 1.

The method accordingly uses two processes known in the manufacture of surface mount devices—a flip chip mounting process is used to form the electrical connections and then a process normally used for dispensing solder material, and hence here for making electrical connections to sidewalls is used to form the heat transfer elements 22 of solder. This means that the process can be carried out by existing manufacturing equipment.

The additional heat paths provided reduce the temperature of the light emitting device in use. Heat transfers not just through the electrical contacts 8 and contact pads 12 but also through the insulating substrate 4, heat transfer elements 22 of solder and then onto board 10. Moreover, further heat transfer occurs from the phosphor 16, heat transfer elements 22 and board 10. In this way, the temperature of the light emitting device for any given applied current and voltage to the light emitting layer 6 can be minimised, which in turn can increase the lifetime of the chip for constant light output or alternatively allow for additional light output.

An alternative process flow uses a combined flip chip assembly process and solder fillet formation.

In this process, solder is screen printed onto the board 14 both on contact pads 12 and heat sink pads 28. Note that since there is a need for considerable quantities of solder on the heat sink pads this is achieved by overprinting. In this context, overprinting refers to depositing solder not just on the heat sink pads 28 but also around the heat sink pads over blank areas of the board. Then, when the solder is reflowed, the solder preferentially wets the heat sink pads 28 and pulls back to that area creating a larger volume of solder on the heat sink pad than would be the case without overprinting.

Then, the light emitting device chip 2 is located at the correct position. A reflow soldering operation then takes place both bonding chip 2 to the contact pads 12 making an electrical connection and also reforming the solder on heat sink pads 28 to form the heat transfer elements 22.

Figure 3:
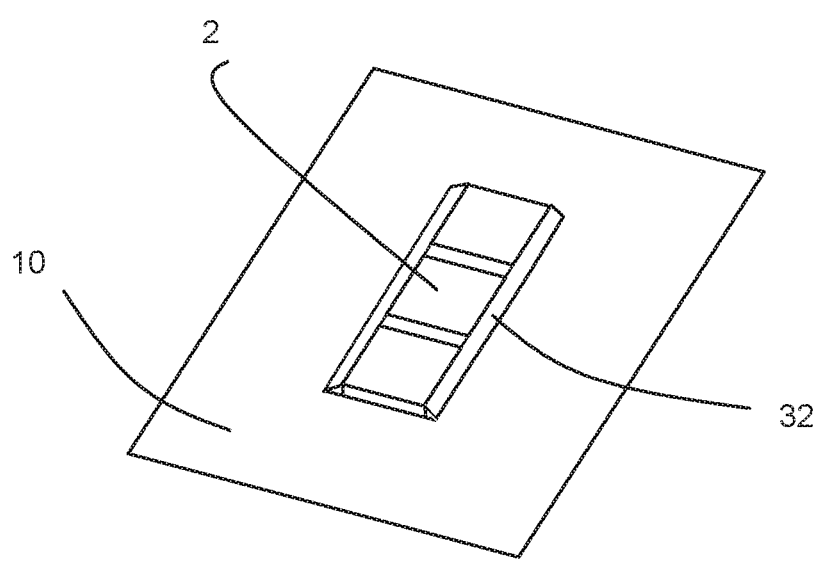
FIG. 3 shows a perspective view of a row of light emitting device chips mounted on a board.

In an alternative arrangement, illustrated in FIG. 3, a plurality of light emitting device chips 2 are arranged in a line extending longitudinally. A solder line 32 extending longitudinally is provided contacting the lateral side walls of the device chips. In this way, a higher density of chips on the board can be achieved. In this case, the sidewall metallisations 20 are provided only on the opposed lateral sidewalls of the device chips 2.

In the arrangement of FIGS. 1 and 2 the heat dissipation regions 14 are simply part of the board 10 without electrical contacts—the heat sink pads define an area to be wet by solder but are not connected electrically.

In alternative arrangements, the heat dissipation regions of the board may be adapted for improved heat transfer.

In one arrangement, the board 10 is an insulated metal substrate with a metal core with an insulated surface. The metal core allows for good heat conduction.

Figure 4:
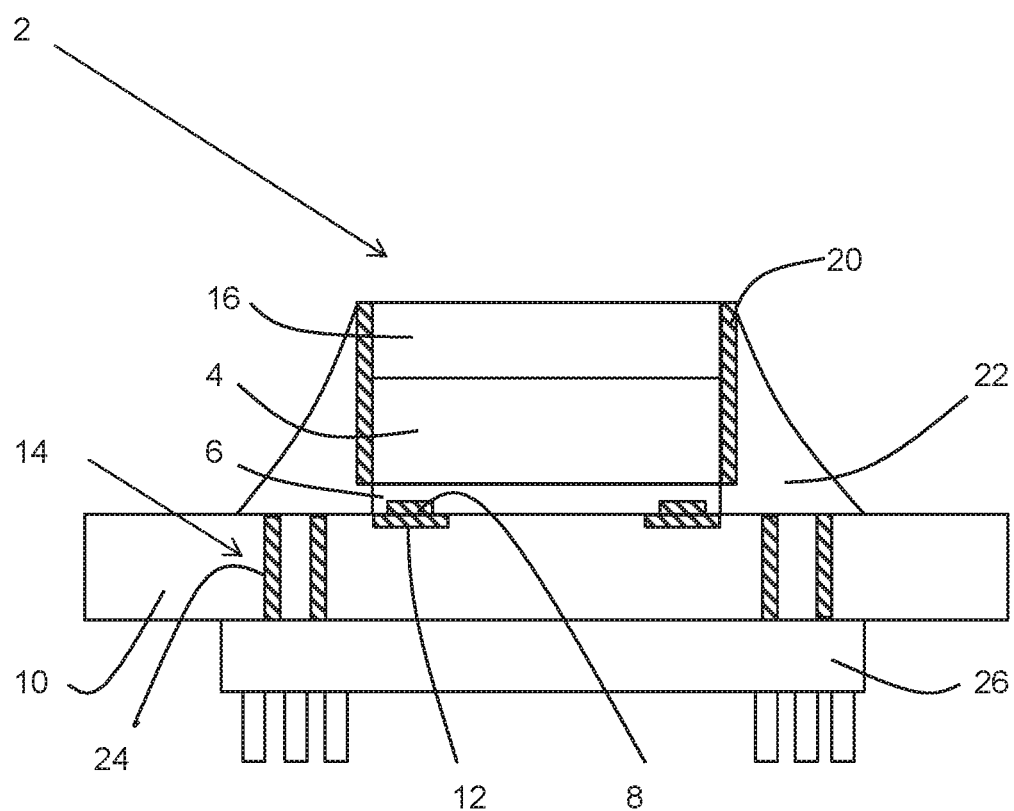
FIG. 4 shows a second embodiment of a light emitting device according to the invention.

In an alternative arrangement, referring to FIG. 4, the heat dissipation regions 14 comprise a plurality of thermal vias 24, vias through the board filled with metal. The thermal vias 24 are in thermal contact with a heat sink 26.

Note that in this arrangement the heat sink pads 28 illustrated in the arrangement of FIG. 1 are absent. However, in a further alternative heat sink pads 28 may be additionally provided in the arrangement of FIG. 4.

In this embodiment, the sidewall metallisations 20 are shown as not extending over the light emitting layer 6. However, as an alternative, the sidewall metallisations 20 may extend over the light emitting layer 6, with this layer containing a light emitting diode isolated from the edges of the light emitting layer 6 as in the example of FIG. 1.

Note that a heat sink 26 as illustrated in FIG. 4 may optionally be provided on the rear of the substrate illustrated in FIG. 1 as well.

Figure 5:
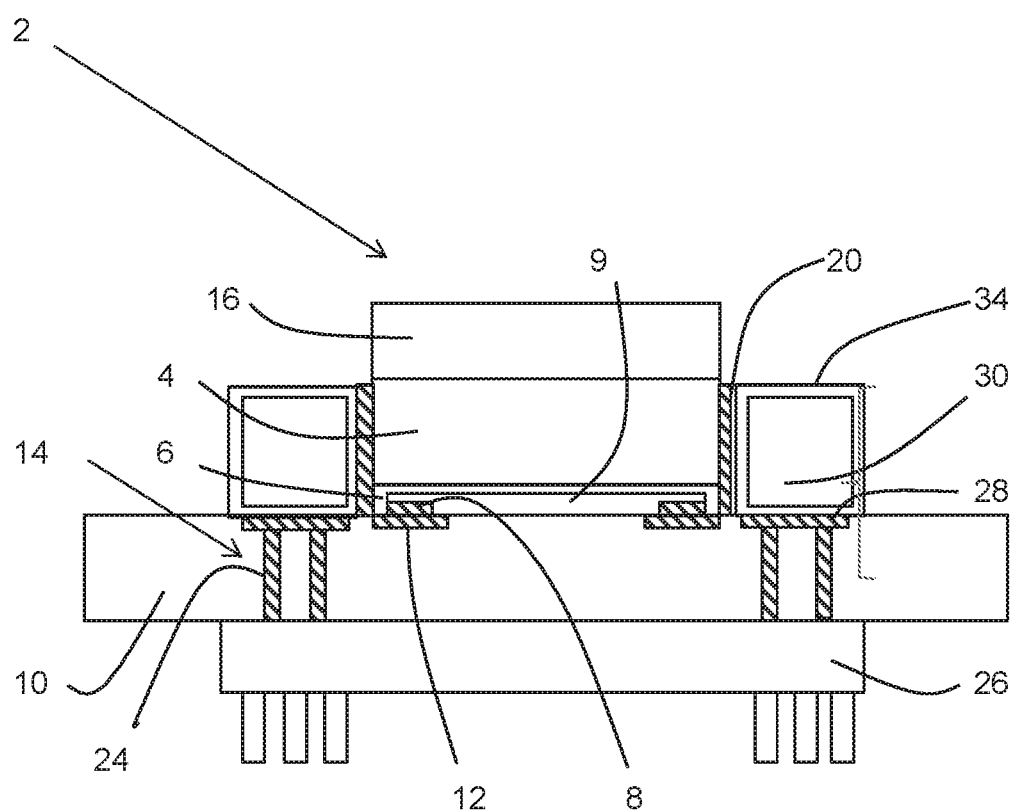
FIG. 5 shows a third embodiment of a light emitting device according to the invention.

In a further arrangement, referring to FIG. 5, the metal heat transfer elements between sidewall metallisation 20 and heat sink pads 28 are in the form of a metal frame 30 surrounding the chip 2 in contact with the metallised sidewalls 20. The metal frame 30 provides an additional heat conduction path. The metal frame 30 may be soldered to the sidewall metallisations 20 and to the heat dissipation regions 14 of the board 10.

The metal frame is of approximately the same height as the chip 2, i.e. the height of the metal frame is between 50% and 150% of the combined height of the chip 2 including phosphor 16, insulating substrate 4 and semiconductor light emitting layer 6. Preferably, the height is between 80% and 120% of the combined height of the chip 2. The metal frame is preferably rectangular to match the rectangular chip with four limbs surrounding the chip 2. The width of each limb of the metal frame is of the same order as the height of the metal frame preferably between 50% and 300% of the height of the metal frame.

The metal frame 30 may preferably be of copper, with aluminium as an alternative. A solderable layer 34 is provided over the metal frame, for example Ni/Au, Sn or any solderable metal.

There are a number of methods that may be used to manufacture a device with a metal frame 30.

In a first approach, the metal frame 30 is pre-attached around the chip 2 and phosphor 16, using a first higher melting point solder. Then, the chip 2 and metal frame 30 as a unit are surface-mounted to board 14 by screen printing a second lower melting point solder onto the board, on both heat sink pads 28 and contact pads 12, aligning the chip 2 and metal frame 30 with the frame 30 above heat sink pads 28 and the electrical contacts 8 above contact pads 12, and then carrying out a reflow process by heating the solder. Tin/Silver/copper solder is suitable as second lower melting point solder.

In a second approach, solder deposits are formed by screen printing on board 14 as above. The chip 2 is placed on the correct location on board 14 and the metal frame 30 placed around the chip 2. Solder is pre-applied on the upper layer of the metallised sidewalls 20 of chip 2. A reflow process is then carried out to melt the solder to form the arrangement illustrated in FIG. 5.

In a third approach, the chip 2 is first surface mounted onto board 14 using a first higher melting point solder to solder electrical contacts 8 onto contact pads 12. Then, a second lower melting point solder is applied on heat sink pads 28 and the metal frame 30 placed around the chip 2 on the heat sink pads. A reflow process is then carried out to melt the second lower melting point solder to form the arrangement illustrated in FIG. 5.

Those skilled in the art will realise that further variations can be made to these methods.

The examples described above describe the use of a sapphire substrate. However, other substrate materials are known to those skilled in the art and may be used.

Figure 6:
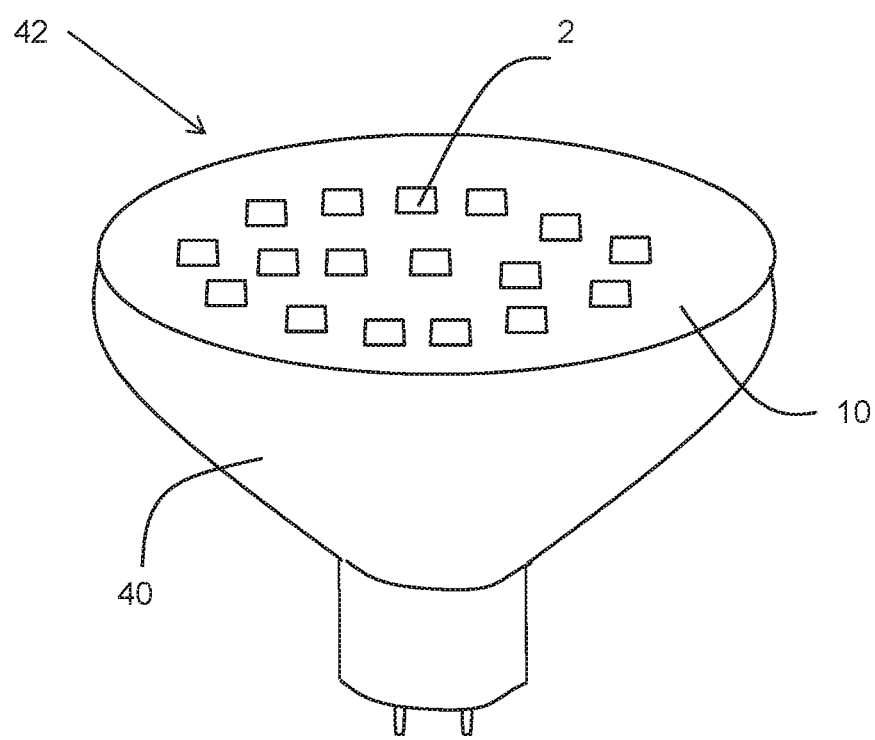
FIG. 6 illustrates a luminaire with a plurality of light emitting device chips.

The above arrangements for mounting light emitting device chips to a board are of particular application in a luminaire as illustrated in FIG. 6, which shows a plurality of light emitting device chips 2 mounted to board 10 contained within a housing 40 which collectively make up a luminaire 42. The light emitting device chips 2 are mounted to board 10 as discussed above. By providing an additional thermal path for heat to be extracted from the light emitting device chips 2 the long term reliability and light output of luminaire 42 can be enhanced.

Figure 7:
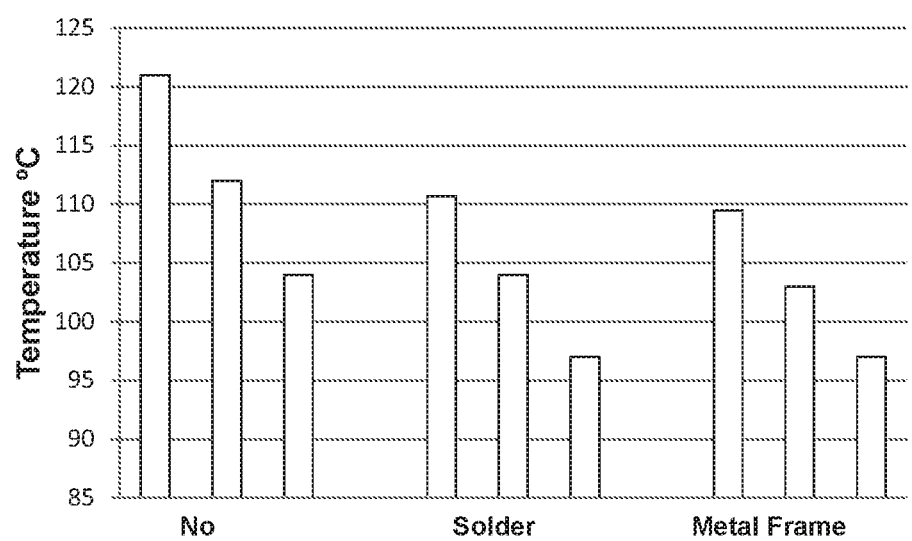
FIG. 7 illustrates temperature reductions using embodiments of the invention.

Thermal simulations have been carried out on a 4.5 W LED with a number of different values of thermal conductivity k (in W/mK) of the side heat transfer elements 22. FIG. 7 shows the temperature of the phosphor, the junction, and the interconnect (from left to right in that order) in three cases, firstly without any side contact, secondly with solder side contacts as in the embodiment of FIG. 1, and thirdly with a metal frame as in the embodiment of FIG. 5.

It will be seen that by providing significant thermal conductivity at the sidewalls (second and third set of temperatures) operating temperatures for the junction of the chip can be reduced by 8° C. Thus, the embodiments measured provide a significant improvement in operating condition.

The metals on the sidewall of the chip may be varied. For example, instead of or in addition to an Al layer an Ag layer may be used as the reflective layer. A Sn layer may be provided on top of the NiAu layer to further improve solderability. Other solderable combinations may be used if required.

The chip and phosphor may be varied as required. Although the above embodiments described the use of a sapphire substrate 4, other substrate materials such as insulating semiconductor may be used if required.

In many of the embodiments disclosed, the sidewall metallisations cover the whole of the side surface of the chip 2, including the insulating substrate 4, the semiconductor layer 6 and the phosphor 16. This makes for easier manufacture. In this case, the electrical contacts 8 are spaced away from the sidewalls to ensure electrical separation. In alternative arrangements, the sidewall metallisations 20 may be patterned to cover the phosphor 16 and part of the insulating substrate 4 but spaced away from the semiconductor layer to improve electrical isolation of the sidewall metallisations from the light emitting device in semiconductor layer 6.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light emitting device, comprising:
    a light emitting device chip comprising an insulating substrate, a light emitting semiconductor layer with a light emitting region and electrical contacts, the light emitting semiconductor layer being on the substrate and the electrical contacts being on a side of the light emitting semiconductor layer facing away from the substrate;
    a board comprising at least one heat dissipation region and a plurality of contact pads connected to the electrical contacts, the heat dissipating region comprising at least one isolated heat sink pad, and the light emitting device chip being mounted on the board with the side of the light emitting semiconductor layer facing away from the substrate;
    sidewall metallisations on the sidewalls of the light emitting device chip, the sidewall metallisations being electrically isolated from the light emitting semiconductor layer; and
    a heat transfer element comprising solder;
    the heat transfer element being in contact with the sidewall metallisations and covers the at least one isolated heat sink pad of the heat dissipation region of the board.

2. A light emitting device according claim 1 wherein:
the solder affixes a thermally conductive metal frame around the light emitting device chip.

3. A light emitting device according to claim 1 wherein the light emitting device chip further comprises a phosphor on the surface of the insulating substrate opposite to the light emitting semiconductor layer.

4. A light emitting device according to claim 1 wherein each heat dissipation region comprises a plurality of vias containing metal.

5. A light emitting device, comprising:
a light emitting device chip comprising an insulating substrate, a light emitting semiconductor layer with a light emitting region and electrical contacts, the light emitting semiconductor layer being on the substrate and the electrical contacts being on a side of the light emitting semiconductor layer facing away from the substrate;
a board comprising at least one heat dissipation region and a plurality of contact pads connected to the electrical contacts, the heat dissipating region comprising at least one isolated heat sink pad, and the light emitting device chip being mounted on the board with the side of the light emitting semiconductor layer facing away from the substrate;
sidewall metallisations on the sidewalls of the light emitting device chip, the sidewall metallisations being electrically isolated from the light emitting semiconductor layer; and
a heat transfer element comprising metal;
the heat transfer element being in contact with the sidewall metallisations and covers the at least one isolated heat sink pad of the heat dissipation region of the board,
wherein the board has a metal core and an insulated surface.

6. A light emitting device, comprising:
a light emitting device chip comprising an insulating substrate, a light emitting semiconductor layer with a light emitting region and electrical contacts, the light emitting semiconductor layer being on the substrate and the electrical contacts being on a side of the light emitting semiconductor layer facing away from the substrate;
a board comprising at least one heat dissipation region and a plurality of contact pads connected to the electrical contacts, the heat dissipating region comprising at least one isolated heat sink pad, and the light emitting device chip being mounted on the board with the side of the light emitting semiconductor layer facing away from the substrate;
sidewall metallisations on the sidewalls of the light emitting device chip, the sidewall metallisations being electrically isolated from the light emitting semiconductor layer; and
a heat transfer element comprising metal;
the heat transfer element being in contact with the sidewall metallisations and covers the at least one isolated heat sink pad of the heat dissipation region of the board,
wherein the light emitting device is a luminaire.

7. A method of bonding a light emitting device chip to a board, the light emitting device chip comprising an insulating substrate, a light emitting semiconductor layer with a light emitting region and electrical contacts, wherein the light emitting semiconductor layer is on the substrate and the electrical contacts are on a side of the light emitting semiconductor layer facing away from the substrate, the board comprising at least one heat dissipation region, a plurality of contact pads, and at least one isolated heat sink pad, the method comprising:
flip chip bonding the light emitting device chip to the board, with the electrical contacts on the first major surface being connected to corresponding contact pads on the board;
soldering sidewall metallisations to the light emitting device chip, the sidewall metallisations being electrically isolated from the light emitting semiconductor layer; and
providing a metal heat transfer element in contact with the sidewall meallisations and covering the at least one isolated heat sink pad of the heat dissipation regions of the board.

8. A method according to claim 7,
wherein the step of soldering the sidewall metallisations comprises introducing solder and providing heat to melt the solder to cover the sidewall metallisations and the isolated heat sink pad and to extend between the sidewall metallisations and the isolated heat sink pad forming the heat transfer element.

9. A method according to claim 7, wherein the step of flip chip bonding uses a first solder and the step of soldering the sidewall metallisations uses a second solder, the second solder having a lower melting point than the first solder.

10. A method according to claim 7, further comprising flip chip bonding a plurality of said light emitting device chips to said board to manufacture a luminaire.

11. A method of bonding a light emitting device chip to a board, the light emitting device chip comprises an insulating substrate, a light emitting semiconductor layer with a light emitting region, electrical contacts and sidewall metallisations electrically isolated from the light emitting semiconductor layer, wherein the light emitting semiconductor layer is on the insulating substrate and the electrical contacts are on a side of the light emitting semiconductor facing away from the substrate; and the board comprising at least one heat dissipation region, a plurality of contact pads, and at least one isolated heat sink pad, the method comprising:
flip chip bonding the light emitting device chip to the board, with the electrical contacts being connected to the corresponding contact pads on the board;
providing a metal frame around the light emitting device chip and solder between the metal frame and the at least one isolated heat sink pad of the board and between the metal frame and the sidewall metallisations; and
reflowing the solder to fix the metal frame to the board.

* * * * *